United States Patent [19]

Takahashi et al.

[11] Patent Number: 4,747,110
[45] Date of Patent: May 24, 1988

[54] SEMICONDUCTOR LASER DEVICE CAPABLE OF EMITTING LASER BEAMS OF DIFFERENT WAVELENGTHS

[75] Inventors: Yasuhito Takahashi, Hirakata; Mototsugu Ogura, Takaichi; Nobuyasu Hase, Atusgi, all of Japan

[73] Assignee: Matsushita Electric Industrial Co., Ltd., Kadoma, Japan

[21] Appl. No.: 829,090

[22] Filed: Feb. 13, 1986

[30] Foreign Application Priority Data

Feb. 13, 1985 [JP] Japan ................................. 60-25508
Feb. 20, 1985 [JP] Japan ................................. 60-32041

[51] Int. Cl.$^4$ .............................................. H01S 3/19
[52] U.S. Cl. ...................................... 372/50; 372/23; 372/46
[58] Field of Search ...................... 372/50, 44, 45, 46, 372/23

[56] References Cited

U.S. PATENT DOCUMENTS

| | | | |
|---|---|---|---|
| 4,318,059 | 3/1982 | Lang et al. ............................ | 372/50 |
| 4,476,563 | 10/1984 | Van Ruyven ......................... | 372/50 |
| 4,577,207 | 3/1986 | Copeland ............................. | 372/50 |
| 4,607,370 | 8/1986 | Mukai et al. ......................... | 372/50 |
| 4,627,065 | 12/1986 | Logan et al. ......................... | 372/50 |

FOREIGN PATENT DOCUMENTS

| | | | |
|---|---|---|---|
| 0086008 | 8/1983 | European Pat. Off. ............. | 372/50 |
| 0079791 | 5/1983 | Japan .................................... | 372/50 |

Primary Examiner—James W. Davie
Attorney, Agent, or Firm—Wenderoth, Lind & Ponack

[57] ABSTRACT

A semiconductor laser device has a compound semiconductor substrate, a first semiconductor layer disposed on the compound semiconductor substrate, and a second semiconductor layer disposed on the first semiconductor layer. The second semiconductor layer has at least three thin film layers of at least two different semiconductor compounds, the film layers being laminated with the different semiconductor compound layers alternating. An electrically isolating region extends through the thickness of the second semiconductor layer and electrically divides the second semiconductor layer into first and second portions which differ in quantum level from each other. A third semiconductor layer is disposed on the second semiconductor layer, and first and second electrodes are disposed on the third semiconductor layer in positions for supplying current to the first and second portions, respectively, and a third electrode is disposed on the substrate at the surface thereof opposite to the first and second electrodes. When a voltage is applied between the third and first electrodes and the third and second electrodes, laser beams having different wavelengths are emitted from the first and second portions of the second semiconductor layer, respectively.

20 Claims, 4 Drawing Sheets

Fig. 3
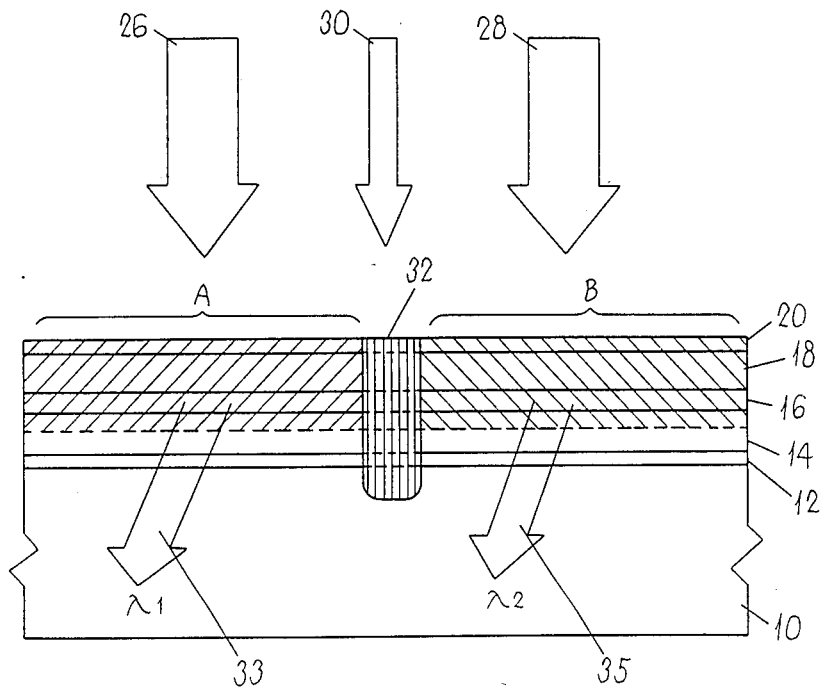
Fig. 4a
Fig. 4b
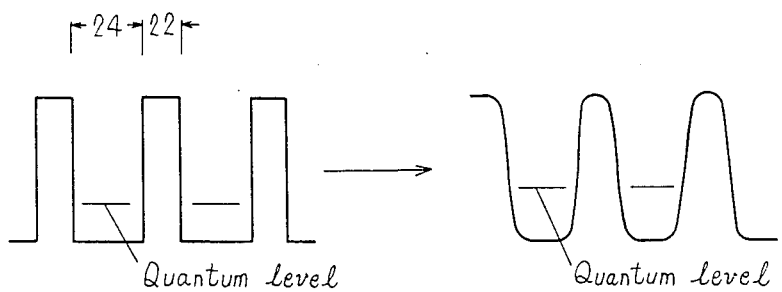

SEMICONDUCTOR LASER DEVICE CAPABLE OF EMITTING LASER BEAMS OF DIFFERENT WAVELENGTHS

BACKGROUND OF THE INVENTION

This invention relates to a semiconductor laser device which can emit laser beams possessing plural different oscillation wavelengths.

In the field of recent optical information processing, optical recording and reproducing apparatus such as optical disks have come to be used. In such apparatus, semiconductor lasers for writing, reading and erasing the data are used. Depending on the application, it may be desired to read out right after writing the data, or to write while erasing and then read. In this case, it is advantageous when the wavelength of the semiconductor laser beam for writing ($\lambda_W$) and that of the semiconductor laser beam for reading ($\lambda_R$) are different ($\lambda_W > \lambda_R$). This is because, since these semiconductor lasers are disposed close to each other, mixing in of the writing signal while reading must be avoided, and the spot diameter of the laser beam for reading must be reduced (to shorten the wavelength) for the purpose of accuracy of the reading signal.

Besides, when recording a high quality television picture, too, it is desired to write the brightness signal and color signal by two laser beams differing in wavelength. In such situation, lately, there is an increasing demand for assembling a plurality of semiconductor lasers differing in wavelength into one integral chip. Meanwhile, a semiconductor laser device to emit plural laser beams is strongly demanded also as the light source of optically multiple communications of large capacity.

Conventionally, as a one-chip semiconductor laser capable of emitting plural laser beams, a structure of laminating an ordinary double hetero structure in two layers, removing part of upper double hetero structure, and forming an electrode for a semiconductor laser corresponding to the lower double hereto structure is known [Shiro Sakai; Electronics Lett, 18 (1982) 17]. This semiconductor laser has two semiconductor laser parts, in which when one semiconductor laser part is driven, a laser beam of oscillation wavelength $\lambda_1$ is emitted, and when the other one is driven, a laser beam of oscillation wavelength $\lambda_2$ is emitted ($\lambda_1 \neq \lambda_2$).

Since the electrode material of one semiconductor laser (e.g., Au/Zn) is different from that of the other (e.g., Au/Sn), at least three electrode forming processes are needed. The process is complicated also because the active region of each semiconductor laser is composed of different epitaxial layers. Furthermore, when the gap between the two electrodes provided in the upper double hetero structure is regarded as one semiconductor laser, the sheet resistance increases in the region beneath the electrode located at the lower position, so that the threshold current of oscillation is raised as compared with that of the semiconductor laser between the lower electrode and said electrode at the lower position.

SUMMARY OF THE INVENTION

The present invention, therefore, has as its principal object the provision of a semiconductor laser device in which one active layer is divided into plural active layers, and laser beams of different oscillation wavelengths may be emitted from these divided plural active layers.

This and other objects are accomplished by a semiconductor laser device which comprises a compound semiconductor substrate, a first semiconductor layer disposed on the compound semiconductor substrate, a second semiconductor layer disposed on the first semiconductor layer being formed of two or more different compound semiconductor thin films laminated alternately in three or more layers and possessing plural parts differing in quantum level, and a third semiconductor layer disposed on the second semiconductor layer. Thereby laser beams differing in wavelength are emitted from the plural parts of the second semiconductor layer.

In a specific embodiment, the forbidden band width of the first and third semiconductor layers is equal to or broader than the widest forbidden band of the second semiconductor layer. The material of the compound semiconductor substrate is GaAs, while the semiconductors in the other regions are GaAs and $Al_xGa_{1-x}As$ ($0 \leq x \leq 1$). Said second semiconductor layer is formed by a metal organic chemical vapor deposition method.

This invention also relates to a semiconductor laser device which comprises a compound semiconductor substrate, a first semiconductor layer disposed on the compound semiconductor substrate, a second semiconductor layer disposed on the first semiconductor layer being formed of two or more different compound semiconductor layer thin films laminated alternately in three or more layers and possessing plural parts differing in quantum level by local annealing, a third semiconductor layer disposed on the second semiconductor layer, and an electrically isolated region for electrically isolating the locally annealed plural parts of the second semiconductor layer. Thereby laser beams differing in wavelength are emitted from the plural parts of the second semiconductor layer.

In a specific embodiment, the local annealing is laser annealing. The quantity of local annealing is controlled by the power of laser or amount of the irradiation. The electrically isolating region is formed after local annealing. More specifically, this electrically isolated region is formed by irradiating protons on the first, second, and third semiconductor layers, or by etching and removing the parts of the semiconductor layer corresponding to said electrically isolated region, or by burying silicon nitride, silicon oxide or polymide in said region removed by etching.

This invention also relates to a semiconductor laser device which comprises a compound semiconductor substrate possessing at least one level difference, a first semiconductor layer disposed on the surface having the level difference of the compound semiconductor substrate, a second semiconductor layer disposed on the first semiconductor layer being formed of two or more different compound semiconductor thin films alternately laminated in three or more layers, and a third semiconductor layer disposed on the second semiconductor layer. Thereby laser beams differing in wavelength are emitted from the level difference part of the second semiconductor layer, and first and second parts positioned at both sides of the level difference part.

In a specific embodiment, the level difference part of the second semiconductor layer is an electrically isolated region, and flat first and second parts other than the level difference part are active regions of the semiconductor laser. The level difference part of the second semiconductor layer and flat first and second parts other than the level difference part are all active regions of the semiconductor laser, and the vicinity of the boundary of each region is electrically isolated.

This invention provides various advantages, among which are as follows.

(1) Since semiconductor lasers which emit plural laser beams differing in oscillation wavelength may be easily formed on one chip, it they may be easily applied to laser arrays such as optical disks.

(2) Further, since the laser array to emit plural laser beams may be formed in one epitaxial growth process, the fabrication process is simple, and the laser arrays of extremely excellent characteristics may be produced at with high reproducibility.

(3) Besides, since the oscillation wavelength of laser beam may be freely controlled by regulation of the film thickness in the thin film multilayer region which is an active region, a multiwavelength semiconductor laser capable of emitting laser beams of desired wavelength suited to the photosensitive characteristic of the photosensitive material may be easily formed, so that it may greatly contribute to the optical information processing system using such multiwavelength semiconductor lasers.

(4) When this invention is used in the long wavelength laser of 1.3 $\mu$m band, it may be also applied to optically multiple communications. In the field of optical information processing, an optical recording and reproducing apparatus capable of transferring at high density and high speed is desired, and a semiconductor laser is needed which has a more and more shortened wavelength. In this respect, this invention may be applied not only to a $Ga_{1-x}Al_xAs/GaAs$ system, but also to a $In_{1-x}Ga_xAs_yP_{1-y}/Iup$ system, $In_{1-x}Ga_xAs_yP_{1-y}/In_{1-x}Ga_xP/GaAs$ system, $(Al_xGa_{1-x})_yIn_{1-y}P/GaAs$ system, etc., and it contributes greatly to the realization of a monolithic multiwavelength laser.

While the novel features of the invention are set forth with particularly in the appended claims, the invention, both as to organization and content, will be understood and appreciated, along with other objects and features thereof, from the following detailed description taken in conjunction with the drawings.

BRIEF DESCRIPTION OF THE DRAWINGS

FIG. 3 is a sectional view of the semiconductor laser device of this embodiment;

FIGS. 4a and 4b are drawings to explain the morphological changes of the conduction band by local annealing;

DETAILED DESCRIPTION OF THE PREFERRED EMBODIMENTS

Figure 1:
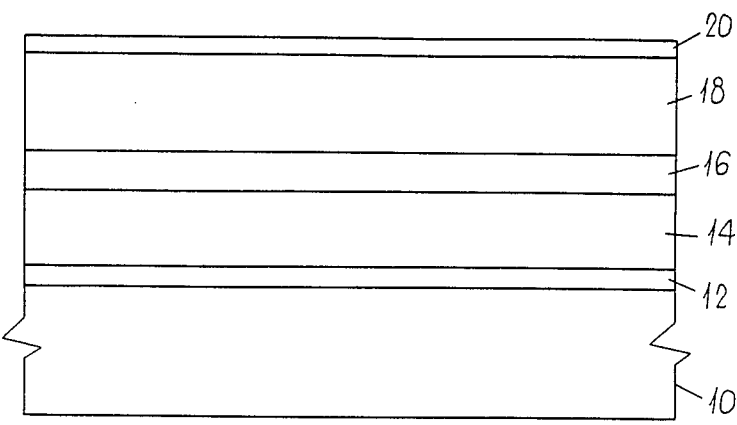
FIG. 1 is a sectional view for explaining the epitaxial growth substrate used in the semiconductor laser device in a first embodiment of this invention.

The semiconductor laser device in a first embodiment of this invention is described below while referring to FIGS. 1 to 4. FIG. 1 shows the laminate structure of the device of this embodiment formed by epitaxial growth. Referring, for example, to the GaAs system as the semiconductor material, in the first place, nGaAs layer 12 as a buffer layer, $nGa_{1-y}Al_yAs$ layer as a clad layer 14, multiquantum well (MQW) layer 16 as an active layer, $pGa_{1-y}Al_yAs$ layer as a clad layer 18, and p+GaAs layer 20 as a cap layer are sequentially developed on n+GaAs substrate 10. In this diagram, the electrode for the semiconductor laser is omitted.

Figure 2:
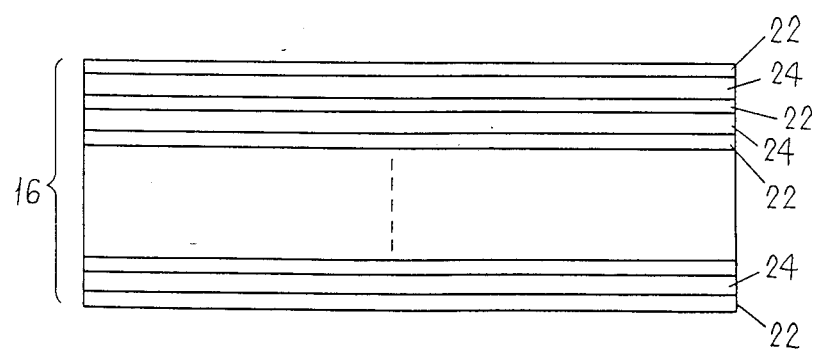
FIG. 2 is a magnified sectional view of essential parts of the same substrate.

FIG. 2 is a magnified view of the MQW layer 16 shown in FIG. 1. The MQW layer 16 is an alternate lamination of thin films of about 20Å to 200Å of a barrier layer such as $Ga_{1-x}Al_xAs$ layer 22 ($0 \leq x \leq 1$, $x \leq y$, which means that the forbidden band width of clad layers 14, 18 is equal to or broader than the widest forbidden band of the MQW layer 16), and the well layer such as GaAs layer 24.

A sectional structure of the semiconductor laser device of this embodiment is shown in FIG. 3, in which, however, electrodes are omitted. After the epitaxial growth as shown in FIG. 1, the surface is locally irradiated with laser beams 26, 28. As the laser, for example, a YAG laser of 5 W output is used. The spot diameter may be reduced to about 5 $\mu$m, and by varying the scanning speed in an order of several milliseconds, the intensity of laser beams 26, 28 may be varied. Since the distance from the surface to the active layer of MQW layer 16 is 1 to 2 $\mu$m, this intensity is enough to raise the temperature to nearly 1000° C. Thus, region A and region B are annealed with a laser in different ways. In the next step, on the boundary of region A and region B, when protons 30 are irradiated on the surface by, for example, 300 KeV, they can penetrate up to about 2 $\mu$m, and this proton exposed region is an electrically isolated region 32.

Incidentally, this MQW layer 16 annealed with a laser has a somewhat indistinct boundary profile between the well layer 24 and barrier layer 22 as shown in FIG. 4 (b), as compared with the band structure of the sharp conduction band after crystal growth shown in FIG. 4 (a). This is because the constituent elements are moved by the energy of the laser annealing. This shape may be changed by altering the intensity of laser annealing. The quantum level of electrons is shown in FIG. 4, in which the quantum level tends to climb as the shape is broken. Accordingly, by varying the laser annealing quantity, a laser beam 33 of $\lambda_1$ wavelength may be emitted from region A, and a laser beam 35 of $\lambda_2$ wavelength from region B. A sufficient difference in the emitted wavelengths of tens of nanometers may be obtained. In the example explained above, two regions are representatively described where three or more emission wavelengths are desired, but if only two wavelengths are enough, in FIG. 3, for example, only one region may be annealed with a laser, while the other region may be directly used after crystal growth. Regions A and B may be electrically isolated either before or after laser annealing. As the method of isolation, in addition to said proton irradiation, it may be also possible to remove the region corresponding to the isolated region 32 by etching, or bury with a $Si_3N_4$ film, $SiO_2$ film, polyimide film or the like after etching and removing. The MQW layer 16 may be formed by either a metal organic chemical vapor deposition method (MOCVD method) or molecular beam epitaxy method (MBE method). The active layer of each semiconductor laser is electrically independent, and it may be modulated independently when driving electrodes are provided individually.

Figure 5:
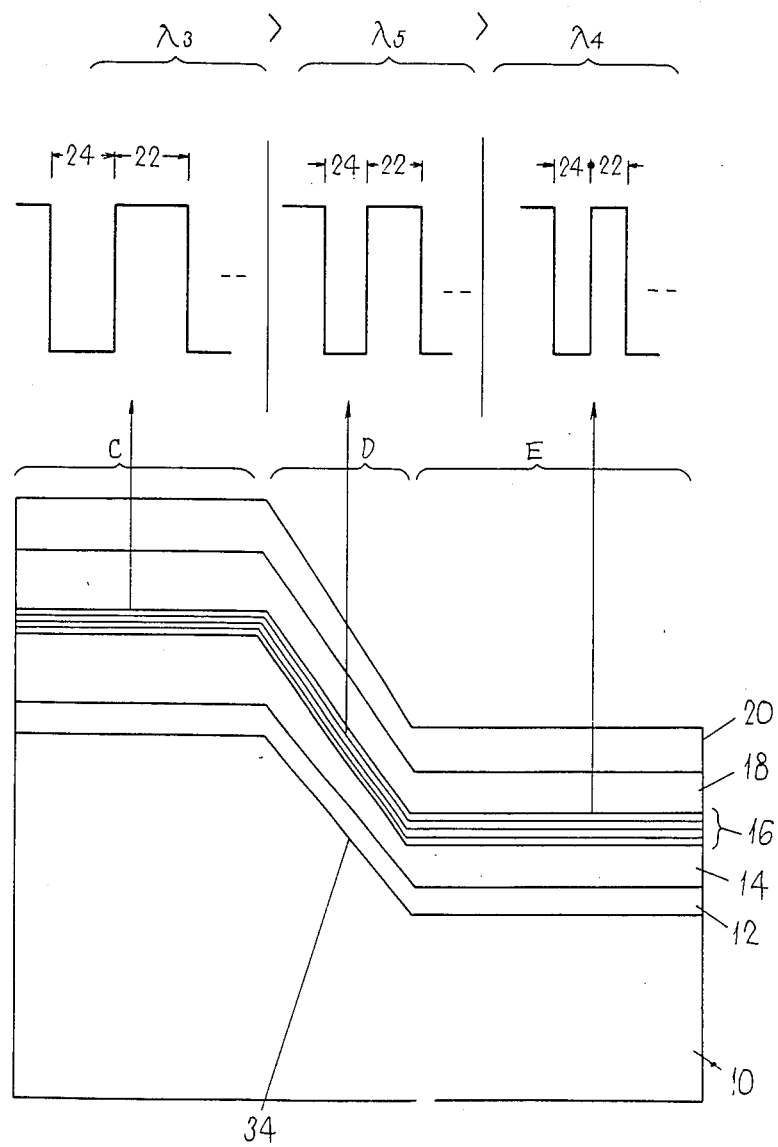
FIG. 5 is a sectional view of the semiconductor laser device in a second embodiment of this invention.

Referring now to a second embodiment, in FIG. 5, a level different 34 is provided by etching the GaAs semiconductor substrate 10, and on this semiconductor substrate 10 with a level difference, a buffer layer GaAs 12, a first clad layer of $Al_xGa_{1-x}As$ ($x \approx 0.4$) layer 14, a thin film multilayer region (SQW layer or MQW layer) 16 being composed of three or more alternate laminates, two or more compound semiconductors differing in composition measuring 10 to 200Å in film thickness, such as $Al_yGa_{1-y}As$ ($y \approx 0.3$) layer and GaAs layer, a second clad layer of $Al_xGa_{1-x}As$ ($x \approx 0.4$) layer 18, and a cap layer GaAs 20 are sequentially formed by epitaxial growth method.

The present inventors discovered as a result of studies that the growth speed varies in the flat region and level difference region when epitaxial growth is formed on a substrate having a level difference structure. That is, conclusively, the thickness of each growth layer varies in each region. This phenomenon is not so serious as to practically affect the oscillation wavelength of the conventional double hetero structure laser, but in the single quantum well (SQW) type laser or multiquantum well (MQW) type laser composed of alternately laminated super thin films, the film thickness of the quantum well layer which is a superthin film differs, and since the oscillation wavelength of these quantum well type lasers depend on the film thickness of this quantum well layer, the oscillation wavelength varies in each region.

As mentioned above, the growth rate of the epitaxial growth layer becomes slow in the sequence of upper flat region, step difference region, and lower flat region, and the thickness of the quantum well layer becomes thin, as a result, in the sequence shown in FIG. 5, so that the relationship of the oscillation wavelength becomes as follows: oscillation wavelength in upper flat region C $\lambda_3$ > oscillation wavelength in step difference region D $\lambda_5$ > oscillation wavelength in lower flat region E $\lambda_4$, so that a multiwavelength semiconductor laser device differing in wavelength in each region may be obtained.

Figure 6:
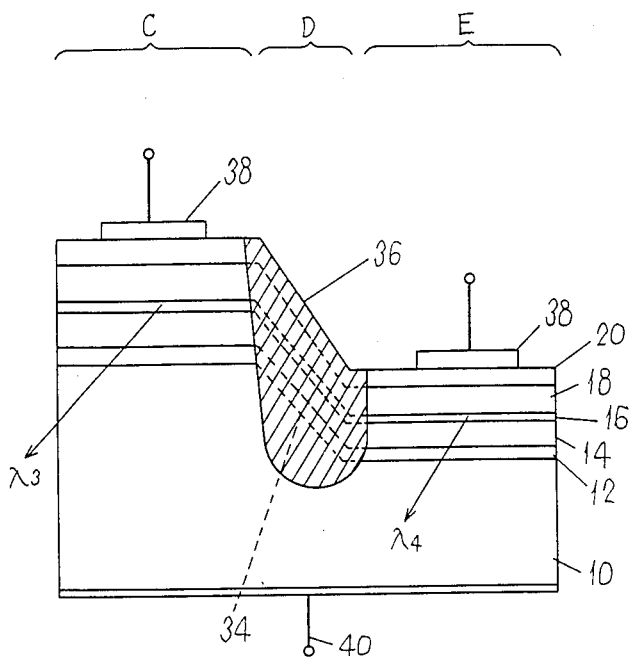
FIG. 6 is a sectional view of the semiconductor laser device in a third embodiment of this invention.

A third embodiment is shown in FIG. 6.

The level difference region is modified into an electrically isolated region 36 by removing the corresponding region by proton irradiation or etching, or burying in this etched region silicon nitride, silicon oxide or polymide, while flat regions C, D are used as active regions of the semiconductor laser. In the flat regions, P type metal electrodes, such as Au/Zn layers 38, 38 are provided, whereas at the substrate side, n type metal electrode, such as An/Sn layer 40 is formed, and when the reflecting plane is formed by opening vertically in the direction of level difference, a semiconductor laser device is obtained as shown in FIG. 6.

Since the semiconductor laser device shown in FIG. 6 has the level difference region D used as an electrically isolated region, the oscillation wavelengths are of two kinds, that is, $\lambda_3$ and $\lambda_4$.

Figure 7:
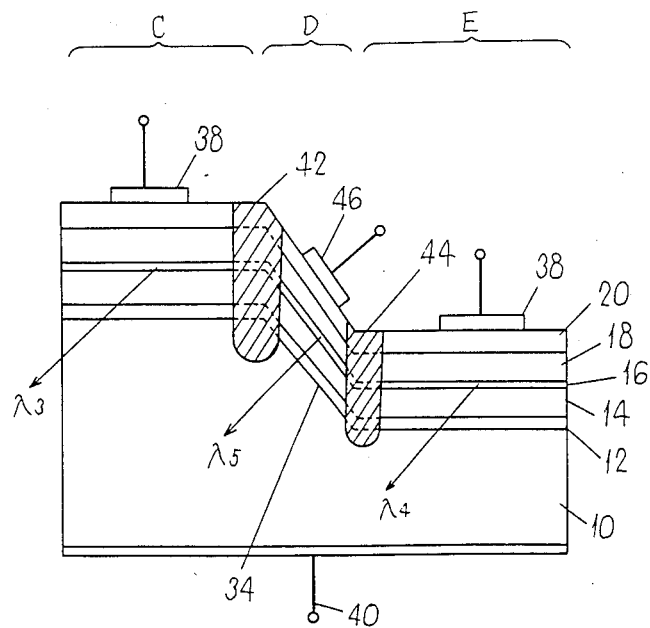
FIG. 7 is a sectional view of the semiconductor laser device in a fourth embodiment of this invention.

Furthermore, a fourth embodiment is described in relation to FIG. 7. The composition of the epitaxial growth layer is same as in the third embodiment, but both flat regions C, E and level difference region D are used as active regions of the semiconductor laser, and the vicinity of the boundary of each region is electrically isolated by providing electrically isolated regions 42, 44 in the same manner as in the first embodiment, thereby forming an electrode 46. In this embodiment, by a single epitaxial growth on a single level difference, a semiconductor laser of three different wavelengths may be obtained. Furthermore, when the composition of this invention is applied to a substrate on which plural level differences are formed, a multiwavelength semiconductor laser may be formed by one process.

The semiconductor laser device shown in the third or fourth embodiment may be applied not only to the $Al_xGa_{1-x}As$/GaAs system, but also to the InGaAsP/InP system. In the fourth embodiment, the emission pattern in the level difference region may be freely changed by the angle of the level difference. For example, when the level difference is a right angle, an emission pattern rotated by 90 degrees as compared with that in the flat region may be easily obtained in the level difference region since the laser beam has an oval emission pattern. Incidentally, the thin film multilayer region and others may be formed either by a metal organic chemical vapor deposition (MOCVD) method or by some other process.

In this embodiment, the active layer of the semiconductor layer is formed by a multi-quantum well layer (MQW layer) or a single-quantum well layer (SQW layer). This MQW layer is composed of an alternately repeated thin film multilayer structure of a well layer and a barrier layer of about 20 to 200Å in thickness. Generally, since the emission wavelength in this MQW layer is determined by the shape or film thickness of the well layer, the shape and film thickness of the well layers of electrically isolated individual MQW layers may be varied by locally annealing with a laser or the like at the time of epitaxial growth, so that the wavelength of the laser beam emitted from each MQW layer may be altered.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed is:

1. A semiconductor laser device comprising:
   a compound semiconductor substrate;
   a first semiconductor layer disposed on said compound semiconductor substrate;
   a second semiconductor layer disposed on said first semiconductor layer, said second semiconductor layer having at least three thin film layers of at least two different semiconductor compounds, said thin film layers being laminated with the different semiconductor compound layers alternating;
   an electrically isolating region extending through the thickness of said second semiconductor layer and electrically dividing said second semiconductor layer into first and second portions which differ in quantum level from each other;
   a third semiconductor layer disposed on said second semiconductor layer;
   first and second electrodes disposed on said third semiconductor layer in positions for supplying current to said first and second portions, respectively; and
   a third electrode disposed on said substrate at the surface thereof opposite to said first and second electrodes,
   whereby when a voltage is applied between said third and first electrodes and said third and second electrodes, laser beams having different wavelengths are emitted from said first and second portions of said second semiconductor layer, respectively.

2. A semiconductor laser device as set forth in claim 1, wherein the forbidden band width of said first and third semiconductor layers is equal to or broader than widest forbidden band of said second semiconductor layer.

3. A semiconductor laser device as set forth in claim 1, wherein the compound semiconductor substrate is made of GaAs, while and the semiconductor in the other regions are made of GaAs and $Al_xGa_{1-x}As$ ($0 \leq x \leq 1$).

4. A semiconductor laser device as set forth in claim 1, wherein said second semiconductor layer is a metal organic chemical vapor deposited layer.

5. A semicondcutor laser device as set forth in claim 1, wherein said local annealing is laser annealing.

6. A semiconductor laser device as set forth in claim 1, wherein quantity of local annealing is controlled by the power of the laser or irradiation amount.

7. A semiconductor laser device as set forth in claim 1, wherein said electrically isolated region is formed after local annealing.

8. A semiconductor laser device as set forth in claim 1, wherein the electrically isolating region is formed by irradiating protons on said first, second, and third semiconductor layers.

9. A semiconductor laser device as claimed in claim 1 in which said first and second portions have been locally annealed for causing the different quantum levels.

10. A semiconductor laser device as claimed in claim 1 wherein the electrically isolating region is formed by etching and removing the parts of the second semiconductor layer corresponding to the electrically isolating region.

11. A semiconductor laser device as claimed in claim 10 wherein the electrically isolating region is formed by burying silicon nitride, silicon oxide or polyamide in the etched portion of said second semiconductor layer.

12. A semiconductor device comprising:
a compound semiconductor substrate having first and second flat surface portions on one side thereof having different heights from the other side of said substrate, and a slanted surface portion connecting said first and second flat surface portions;
a first semiconductor layer disposed on said first, second and slanted surface portions of said compound semiconductor substrate;
a second semiconductor layer disposed on said first semiconductor layer, said second semiconductor layer having at least three thin film layers of at least two different semiconductor compounds, said thin film layers being laminated with the different semiconductor compound layers alternating;
a third semiconductor layer disposed on said second semiconductor layer;
first and second electrodes disposed on the parts of said third semiconductor layer corresponding to said first and second flat surface portions, respectively; and
a third electrode disposed on said substrate at the surface thereof opposite to said first and second electrodes,
when a voltage is applied between said third and first electrodes and said third and second electrodes, laser beams having different wavelengths are emitted from the portions of said laser device which correspond to said first and second flat surface portions, respectively.

13. A semiconductor laser device as set forth in claim 12, wherein said slanted surface portion of said second semiconductor layer is an electrically isolated region, and said flat first and second portions are active regions of the semiconductor laser.

14. A semiconductor laser device as set forth in claim 12, wherein said electrically isolating region is formed by irradiating protons on said first, second, and third semiconductor layers.

15. A semiconductor laser device as claimed in claim 12 wherein the electrically isolating region is formed by etching and removing the parts of the second semiconductor layer corresponding to the electrically isolating region.

16. A semiconductor laser device as claimed in claim 15 wherein the electrically isolating region is formed by burying silicon nitride, silicon oxide or polyamide in the etched portion of said second semiconductor layer.

17. A semiconductor laser device as set forth in claim 12, wherein said slanted surface portion of the second semiconductor layer and said flat first and second portions are all active regions of the semiconductor laser, and said second semiconductor layer has an electrically isolating region in the vicinity of the boundary between the respective surface portions.

18. A semiconductor laser device as set forth in claim 17, wherein the electrically isolating region is formed by irradiating protons on the first, second, and third semiconductor layers.

19. A semiconductor laser device as claimed in claim 17 wherein the electrically isolating region is formed by etching and removing the parts of the second semiconductor layer corresponding to the electrically isolating region.

20. A semiconductor laser device as claimed in claim 19 wherein the electrically isolating region is formed by burying silicon nitride, silicon oxide or polyamide in the etched portion of said second semiconductor layer.

* * * * *